United States Patent
Nakagawa et al.

(10) Patent No.: US 8,399,960 B2
(45) Date of Patent: Mar. 19, 2013

(54) SEMICONDUCTOR DEVICE

(75) Inventors: Yoshihiro Nakagawa, Minato-ku (JP);
Koichiro Noguchi, Minato-ku (JP);
Yoshio Kameda, Minato-ku (JP);
Masayuki Mizuno, Minato-ku (JP)

(73) Assignee: NEC Corporation, Tokyo (JP)

(*) Notice: Subject to any disclaimer, the term of this patent is extended or adjusted under 35 U.S.C. 154(b) by 280 days.

(21) Appl. No.: 12/920,381

(22) PCT Filed: Feb. 20, 2009

(86) PCT No.: PCT/JP2009/052993
§ 371 (c)(1),
(2), (4) Date: Aug. 31, 2010

(87) PCT Pub. No.: WO2009/113373
PCT Pub. Date: Sep. 17, 2009

(65) Prior Publication Data
US 2011/0012228 A1    Jan. 20, 2011

(30) Foreign Application Priority Data
Mar. 13, 2008    (JP) .................. 2008-064165

(51) Int. Cl.
*H01L 27/08* (2006.01)
(52) U.S. Cl. ................ 257/531; 257/685; 257/E25.005; 343/787

(58) Field of Classification Search ............... 257/685, 257/723, 531, E25.005; 343/787
See application file for complete search history.

(56) References Cited

U.S. PATENT DOCUMENTS
2007/0085202 A1    4/2007  Shionoiri

FOREIGN PATENT DOCUMENTS

| | | |
|---|---|---|
| JP | 07-221260 A | 8/1995 |
| JP | 08-236696 A | 9/1996 |
| JP | 10-303367 A | 11/1998 |
| JP | 2000-124406 A | 4/2000 |
| JP | 2004-327568 A | 11/2004 |
| JP | 2005-203657 A | 7/2005 |
| JP | 2006-165287 A | 6/2006 |
| JP | 2007-073812 A | 3/2007 |
| JP | 2007-134694 A | 5/2007 |
| JP | 2007-165459 A | 6/2007 |
| WO | 2007/029435 A1 | 3/2007 |

OTHER PUBLICATIONS

Noriyuki Miura et al., "Analysis and Design of Transceiver Circuit and Inductor Layout for Inductive Inter-chip Wireless Superconnect", IEEE, Symposium on VLSI Circuits Digest of Technical Papers, 2004, pp. 246-249.

*Primary Examiner* — Minh-Loan T Tran
(74) *Attorney, Agent, or Firm* — Sughrue Mion, PLLC

(57) ABSTRACT

A plurality of semiconductor chips are juxtaposed, each having an electromagnetic induction coil disposed thereon. A signal is transmitted by way of electromagnetic induction between the electromagnetic induction coils disposed on a pair of adjacent semiconductor chips.

4 Claims, 15 Drawing Sheets

SEMICONDUCTOR DEVICE

TECHNICAL FIELD

The present invention relates to a semiconductor device for transmitting signals.

BACKGROUND ART

In recent years, SiP (System in Package) systems for performing sophisticated signal processing, each comprising a plurality of integrated semiconductor circuits (hereinafter referred to as "chips") encapsulated in a single package, have been used in a wide range of applications. To meet the growing demand for higher SiP functionality, the number of chips encapsulated in one package is on the increase. However, the large number of chips encapsulated in one package have posed problems in that it is difficult to ensure signal transmission between the chips and the package tends to have an increased volume.

In view of the above problems, there has been developed a packaging apparatus which vertically stacks chips having signal transmission paths perpendicular to the upper surfaces thereof in the form of an electrically conductive material that fills through holes defined in the chips, thereby making packaging means such as wire bonding means unnecessary.

Since the above configuration makes it possible to perform direct signal transmission between the stacked chips, a wider bandwidth can be achieved and the SiP can be reduced in volume.

To carry out another packaging method, there has been developed a semiconductor device comprising chips having electromagnetic induction coils disposed thereon and stacked in a direction perpendicular to the upper surfaces of the chips, for performing signal transmission based on an electromagnetic coupling of the electromagnetic induction coils (see, for example, JP No. 1995-221260 A, JP No. 1996-236696 A, and document: Noriyuki Miura, et al., "Analysis and Design of Transceiver Circuit and Inductor Layout for Inductive Interchip Wireless Super-connect", IEEE 2004 Symposium on VLSI Circuits Digest of Technical Papers, pp. 246-249 (2004)).

Figure 1:
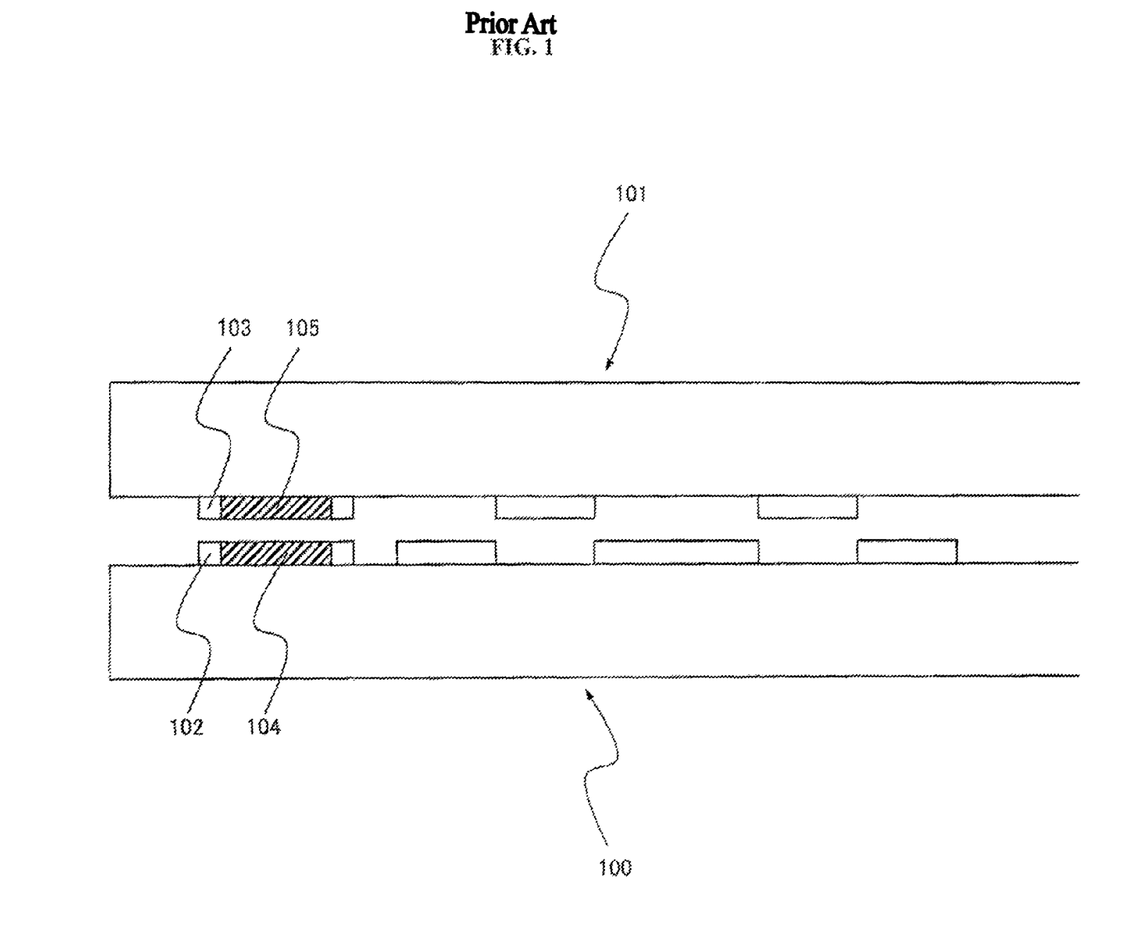
FIG. 1 is a view showing a first form of a general semiconductor device used for signal transmission.

FIG. 1 is a view showing a first form of a general semiconductor device used for signal transmission.

The semiconductor device shown in FIG. 1 includes first circuit chip 100 and second circuit chip 101, having respective electromagnetic induction coils 102, 103 and respective ferromagnetic films 104, 105.

Figure 2:
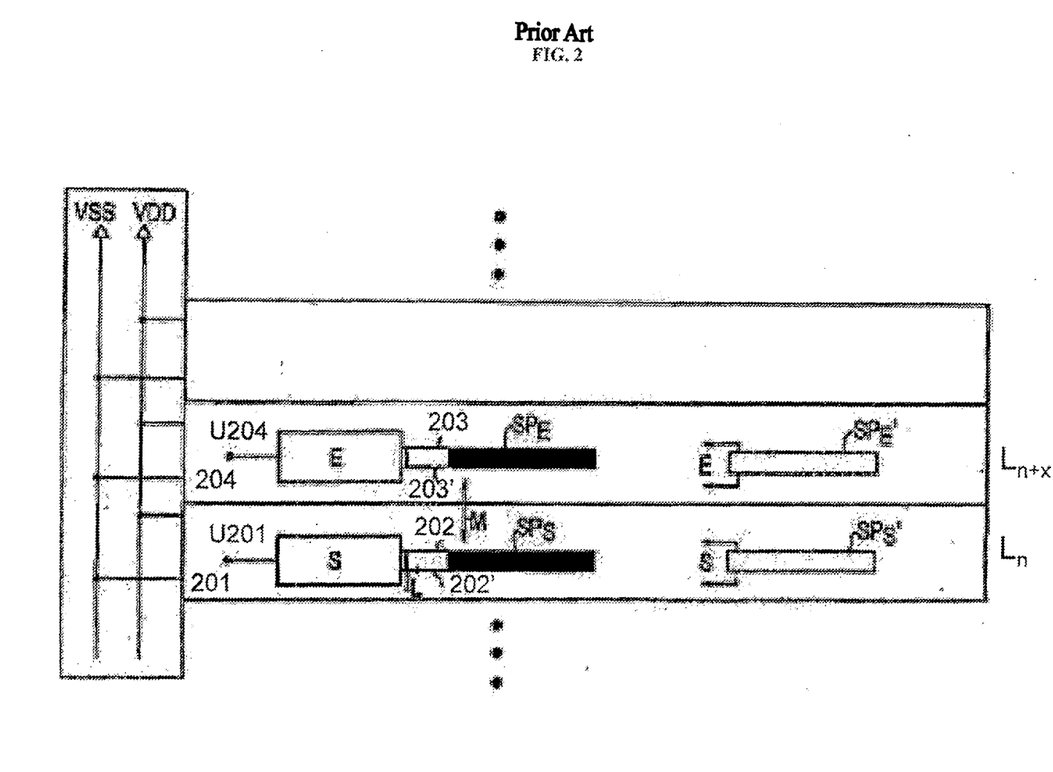
FIG. 2 is a view showing a second form of a general semiconductor device used for signal transmission.

FIG. 2 is a view showing a second form of a general semiconductor device used for signal transmission.

The semiconductor device shown in FIG. 2 comprises three chip layers.

Transmitter S on chip layer $L_n$ has input terminal 201 and output terminals 202, 202', and voltage U201 is applied to input terminal 201. Receiver E on chip layer $L_{n+x}$ has input terminals 203, 203' and output terminal 202, and voltage U204 is applied to output terminal 204.

Figure 3:
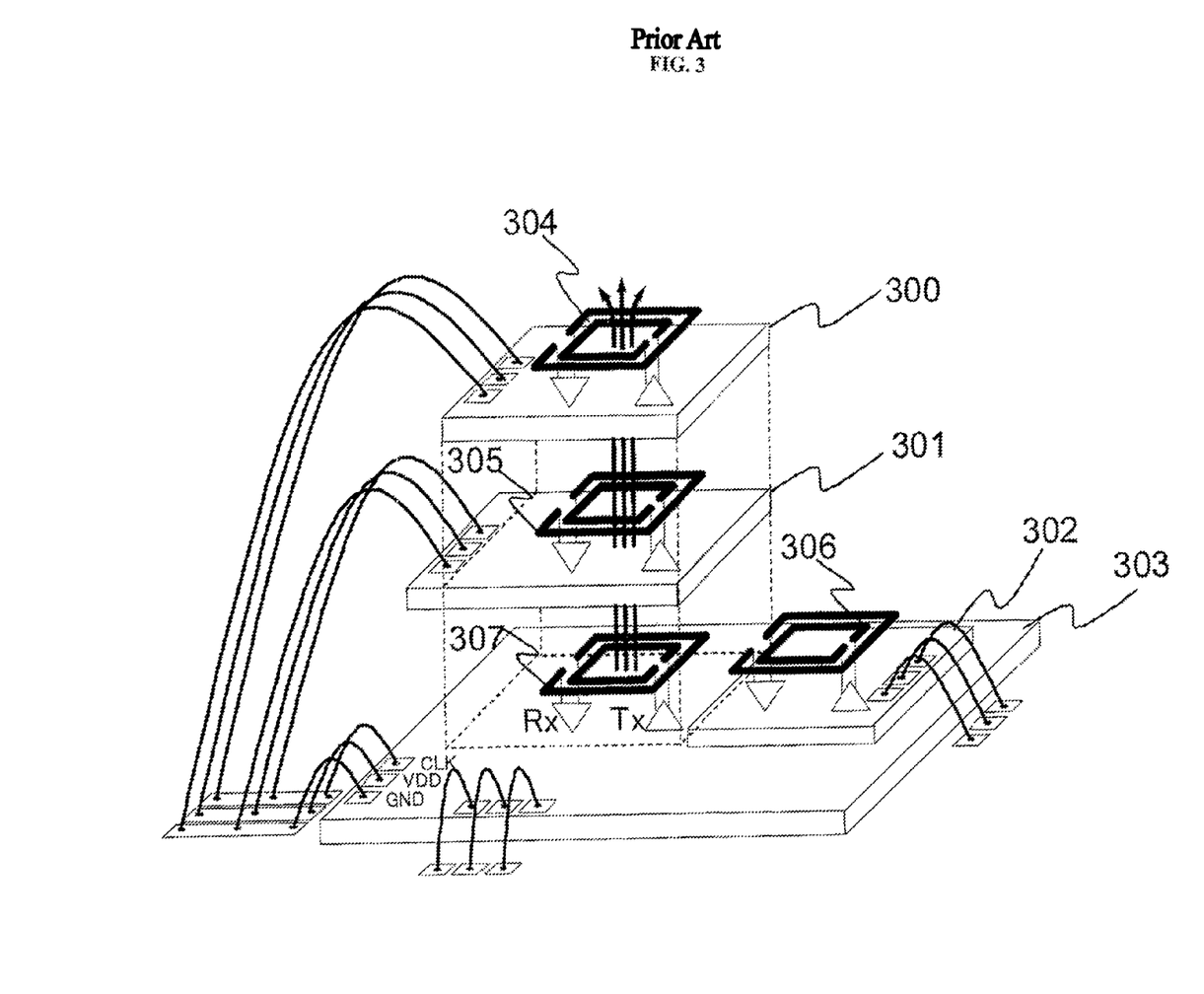
FIG. 3 is a view showing a third form of a general semiconductor device used for signal transmission.

FIG. 3 is a view showing a third form of a general semiconductor device used for signal transmission.

The semiconductor device shown in FIG. 3 comprises memory chips 300, 301, analog chip 302, and logic chip 303 which are stacked together. Electromagnetic induction coil 304 is disposed on memory chip 300, electromagnetic induction coil 305 on memory chip 301, electromagnetic induction coil 306 on analog chip 302, and electromagnetic induction coil 307 on logic chip 303.

The semiconductor devices shown in FIGS. 1 through 3 include electromagnetic induction coils and signal devices disposed on the chips and stacked in a direction perpendicularly to the upper surfaces of the chips and secured in place by adhesive layers or the like.

It is assumed that a coil and a signal device which are disposed in a lower position are used to transmit a signal and a coil and a signal device which are disposed in an upper position are used to receive a signal. The transmission coil is supplied with a current from the signal device in a direction depending on the transmission signal. For example, if a current signal directed clockwise is representative of "1", then the transmission coil generates magnetic fluxes in a downward direction through the reception coil. The reception coil induces a current due to the magnetic fluxes directed therethrough. At this time, the induced current has the same direction as the current supplied to the transmission coil. The induced current or an electric signal such as a voltage converted therefrom is observed by the signal device, thereby performing signal transmission.

If a current signal representative of "0" is to be sent, a current is supplied counter-clockwise, a direction opposite to the direction of the current representative of "1" is supplied, thereby performing signal transmission.

Generally, the signal transmission based on an electromagnetic coupling of electromagnetic induction coils results in a smaller area being occupied by I/O parts than a packaging configuration with area bumps, and makes it possible to produce more highly integrated circuits.

However, the above signal transmission structure is only able to perform signal transmission between chips that are stacked perpendicularly to the upper surfaces of the chips, and is unable to perform signal transmission parallel to the upper surfaces of the chips. Consequently, the above technology is not available in applications where chips cannot be stacked perpendicularly to the upper surfaces thereof due to the heat generated by the chips operation.

Devices other than SiP systems also require signal transmission between chips arrayed parallel to the upper surfaces thereof. For example, one such device is used in a process of inspecting a wafer before it is diced into chips in the fabrication of LSI circuits (wafer level inspection process). Chips on a wafer are made independent of each other by scribe lines that are grounded. When the wafer is diced into the chips, the wafer is cut along the scribe lines. If there are connections extending across the scribe lines, then a problem such as short circuits will arise when the wafer is diced. Consequently, the chips cannot be interconnected by connections extending across the scribe lines. In the wafer level inspection process, therefore, inspection data between the chips cannot be shared by the single wafer, but have to be shared by an external device such as a probe card or the like. As a result, the necessary connections tend to occupy a large area.

DISCLOSURE OF THE INVENTION

In order to solve the above problems, it is an object of the present invention to provide a semiconductor device which is capable of realizing signal transmission between a plurality of chips arrayed parallel to the upper surfaces thereof, using a signal transmission device which occupies a small area.

To achieve the above object, there is provided in accordance with the present invention a semiconductor device comprising a plurality of juxtaposed semiconductor chips each having an electromagnetic induction coil disposed thereon, wherein a signal is transmitted by way of electromagnetic induction between the electromagnetic induction coils disposed on a pair of adjacent semiconductor chips.

According to the present invention, as described above, since a plurality of semiconductor chips are juxtaposed, each having an electromagnetic induction coil disposed thereon, and since a signal is transmitted by way of electromagnetic induction between the electromagnetic induction coils on a pair of adjacent ones of the semiconductor chips, consequently, signal transmission can be realized between a plurality of chips arrayed parallel to upper surfaces thereof, using a signal transmission device which occupies a small area.

BEST MODE FOR CARRYING OUT THE INVENTION

Exemplary embodiments of the present invention will be described below with reference to the drawings.

The exemplary embodiments to be described below are illustrated by way of example, and the present invention is not to be interpreted as being limited to the description and drawings of the exemplary embodiments. For illustrative purposes, the cross-sectional views are shown without hatching.

Figure 4:
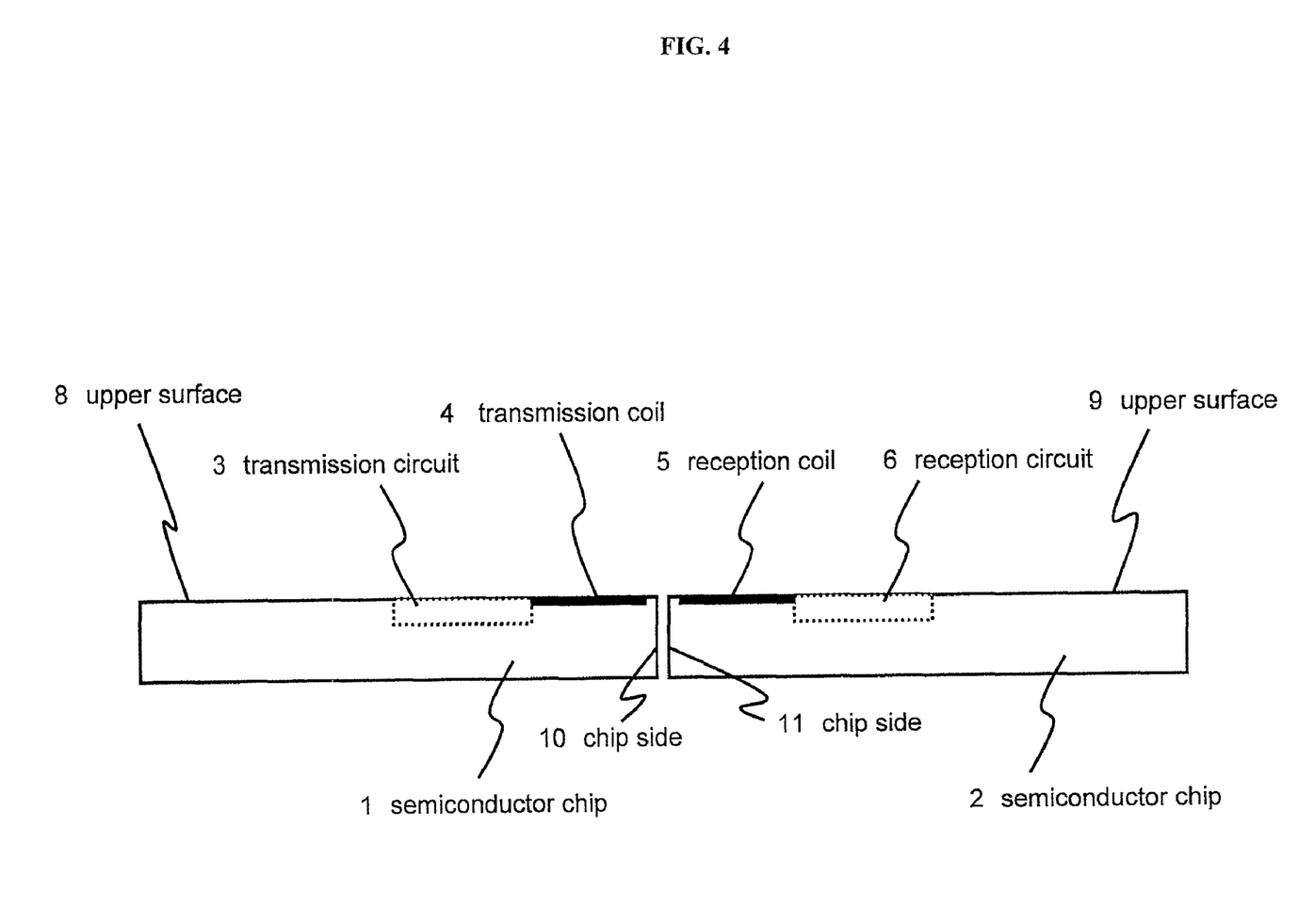
FIG. 4 is a cross-sectional view of a semiconductor device according to an exemplary embodiment of the present invention.

FIG. 4 is a cross-sectional view of a semiconductor device according to an exemplary embodiment of the present invention.

As shown in FIG. 4, the present exemplary embodiment makes it possible to perform signal transmission between adjacent semiconductor chips. According to the present exemplary embodiment, the semiconductor device comprises semiconductor chip 1 and semiconductor chip 2 which are integrated semiconductor circuits, disposed in one plane and having respective chip side 11 and chip side 12 adjacent to each other. Semiconductor chip 1 has transmission circuit 3 and transmission coil 4. Semiconductor chip 2 has reception circuit 6 and reception coil 5. Semiconductor chips 1, 2 are disposed in one plane in that they are arrayed parallel to upper surfaces (face sides) 8, 9 of the chips on which metal films are deposited in the fabrication process of the semiconductor device. Transmission coil 4 and reception coil 5 are used as electromagnetic induction coils. Signals can be transmitted between transmission coil 4 and reception coil 5 by way of electromagnetic induction.

Figure 5:
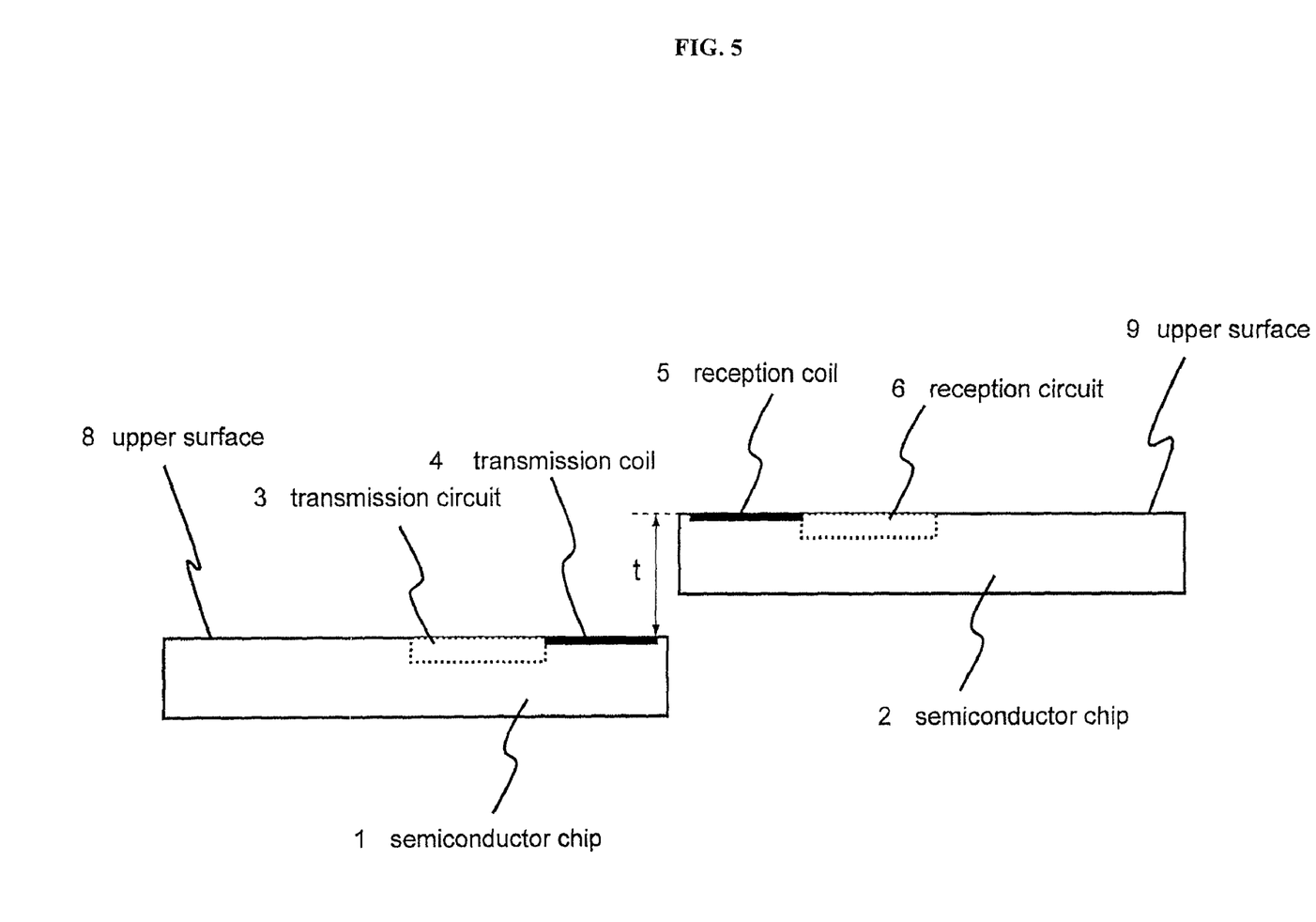
FIG. 5 is a cross-sectional view of a semiconductor device according to another exemplary embodiment of the present invention.

FIG. 5 is a cross-sectional view of a semiconductor device according to another exemplary embodiment of the present invention.

According to the present exemplary embodiment, as shown in FIG. 5, the semiconductor device comprises semiconductor chip 1 and semiconductor chip 2 which are integrated semiconductor circuits, disposed such that upper surfaces 8, 9 thereof are displaced at certain distances from one plane. In other words, upper surfaces 8, 9 are spaced from each other by distance t.

As shown in FIGS. 4 and 5, semiconductor chip 1 and semiconductor chip 2 are disposed (may be disposed in one plane) such that transmission coil 4 and reception coil 5 which are disposed respectively on semiconductor chip 1 and semiconductor chip 2 do not overlap each other in perpendicular projection. Semiconductor chip 1 and semiconductor chip 2 thus disposed are defined as being juxtaposed.

Figure 6:
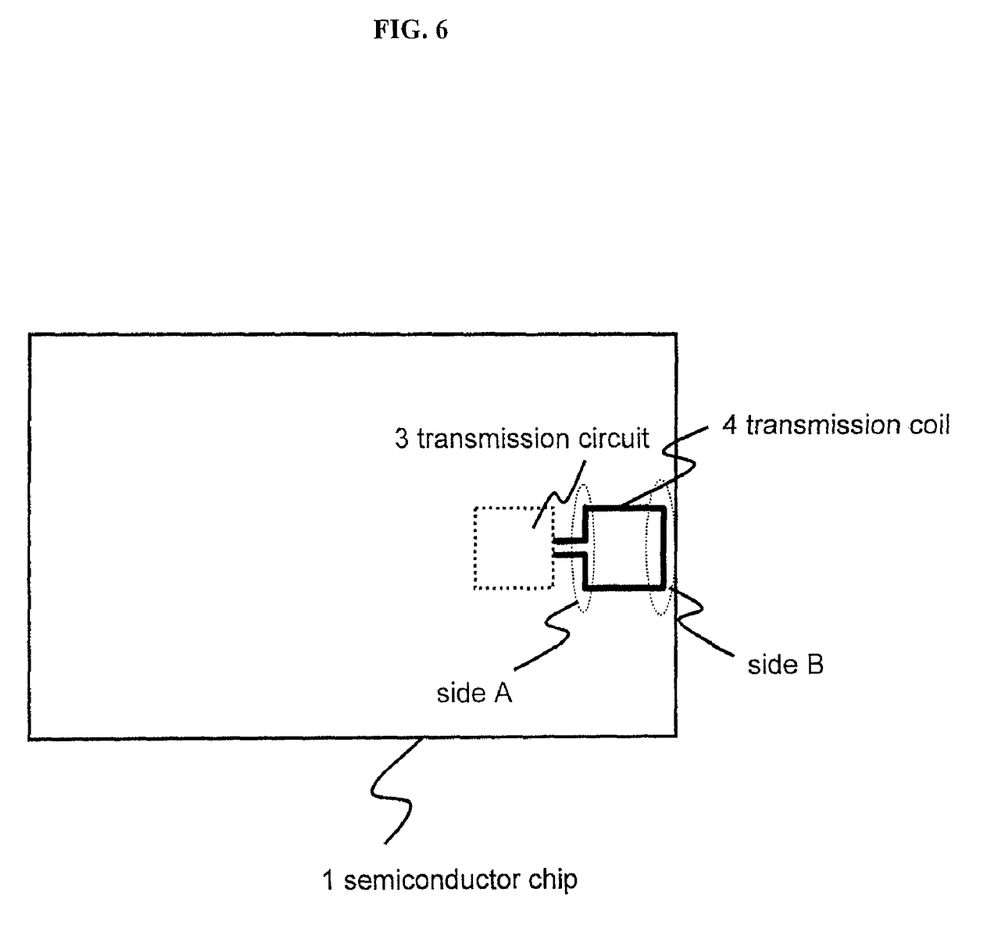
FIG. 6 is a plan view of a semiconductor chip having a transmission circuit shown in FIG. 4 or 5.

FIG. 6 is a plan view of semiconductor chip 1 shown in FIG. 4 or 5.

Semiconductor chip 1 shown in FIG. 4 has square transmission coil 4 connected to transmission circuit 3, as shown in FIG. 6. Transmission coil 4 has side A near transmission circuit 3 and side B opposite to side A.

Figure 7:
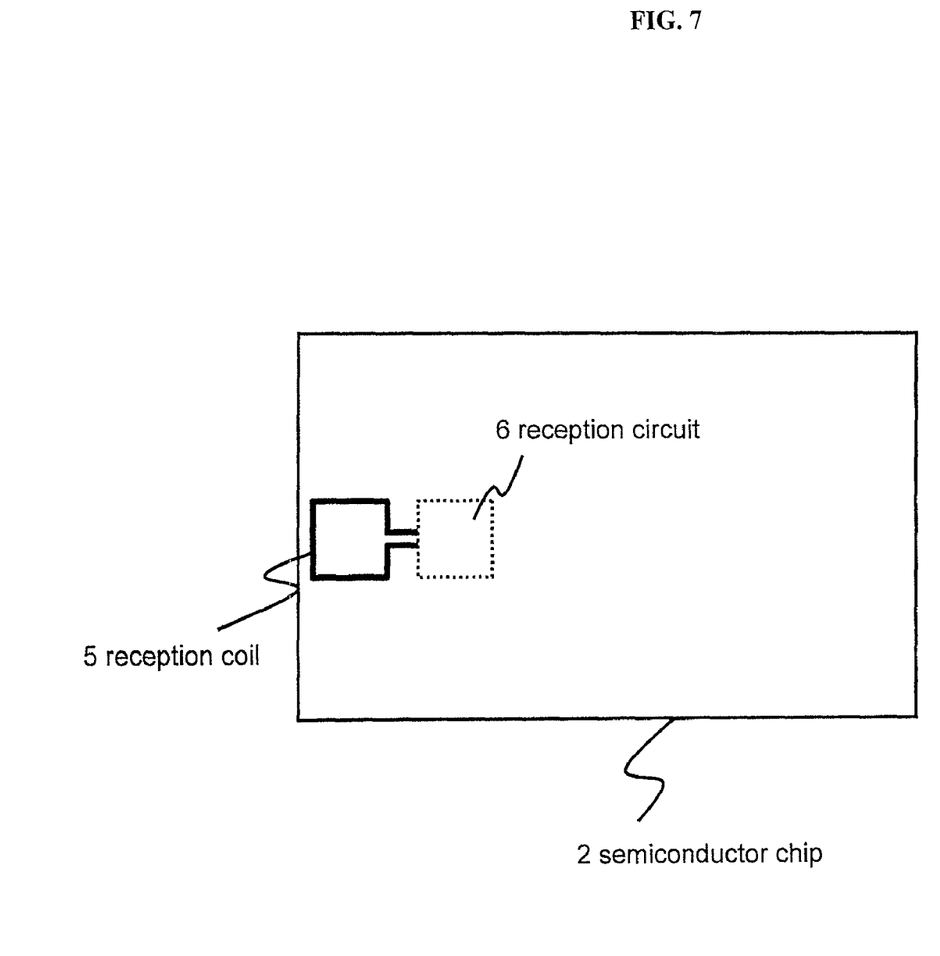
FIG. 7 is a plan view of a semiconductor chip having a reception circuit shown in FIG. 4 or 5.

FIG. 7 is a plan view of semiconductor chip 2 shown in FIG. 4 or 5.

Semiconductor chip 2 shown in FIG. 4 has square reception coil 5 connected to reception circuit 6, as shown in FIG. 7.

Figure 8:
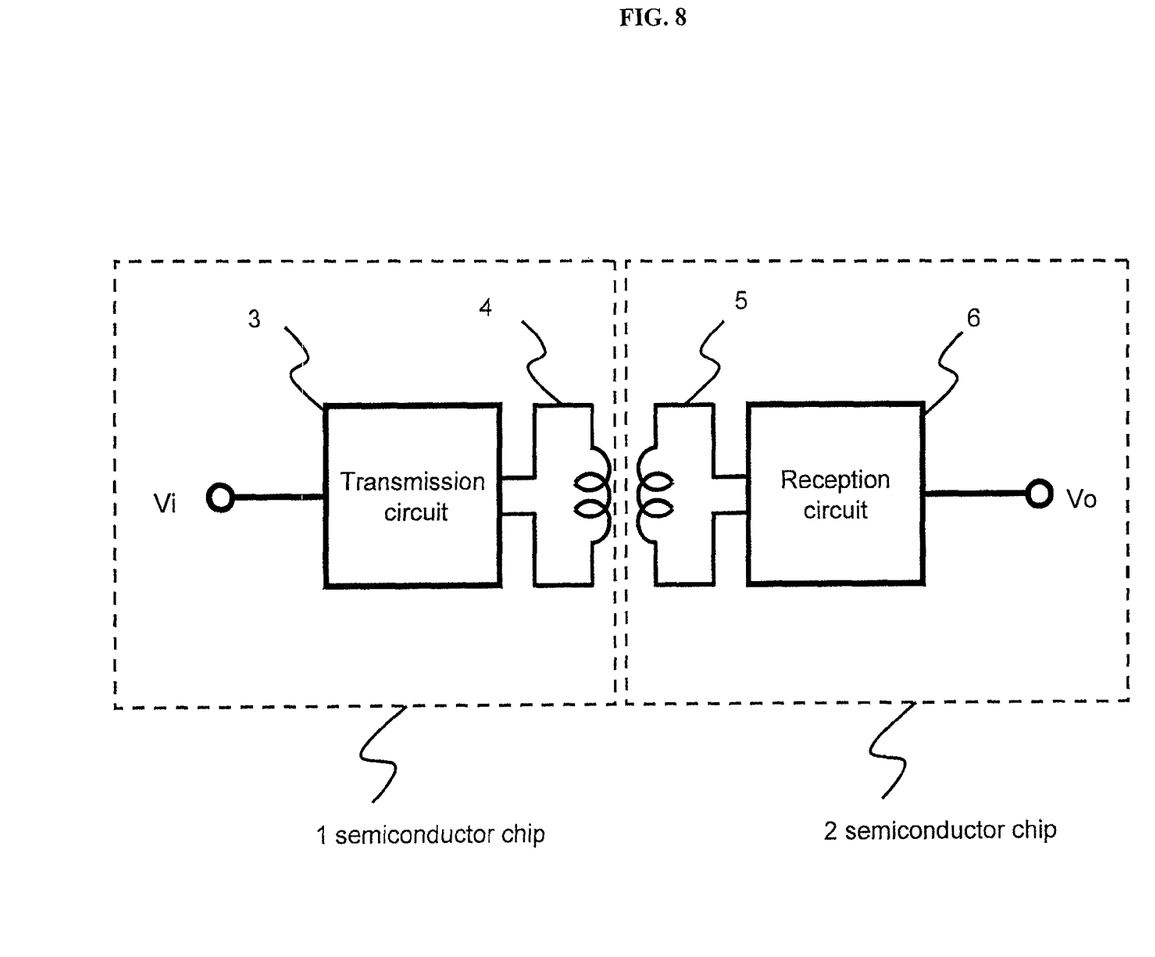
FIG. 8 is a block diagram showing the configuration of the semiconductor device shown in FIG. 4 or 5.

FIG. 8 is a block diagram showing the configuration of the semiconductor device shown in FIG. 4 or 5.

The semiconductor device shown in FIG. 4 has transmission circuit 3 and transmission coil 4 which are connected to each other and reception circuit 6 and reception coil 5 which are connected to each other, as shown in FIG. 8. A terminal for inputting input voltage Vi to transmission circuit 3 is connected. A terminal for outputting output voltage Vo from reception circuit 6 is connected.

For transmitting a signal from semiconductor chip 1 to semiconductor chip 2, input voltage Vi is input to transmission circuit 3. Transmission circuit 3 on semiconductor chip 1 then inputs transmission current depending on transmission data to transmission coil 4. When the current is input to transmission coil 4, transmission coil 4 produces magnetic fluxes. At this time, reception coil 5 on semiconductor chip 2 induces a current by way of electromagnetic induction. A signal that appears across reception coil 5 is sampled by reception circuit 6, which outputs output voltage Vo, thereby realizing signal transmission.

Figure 9:
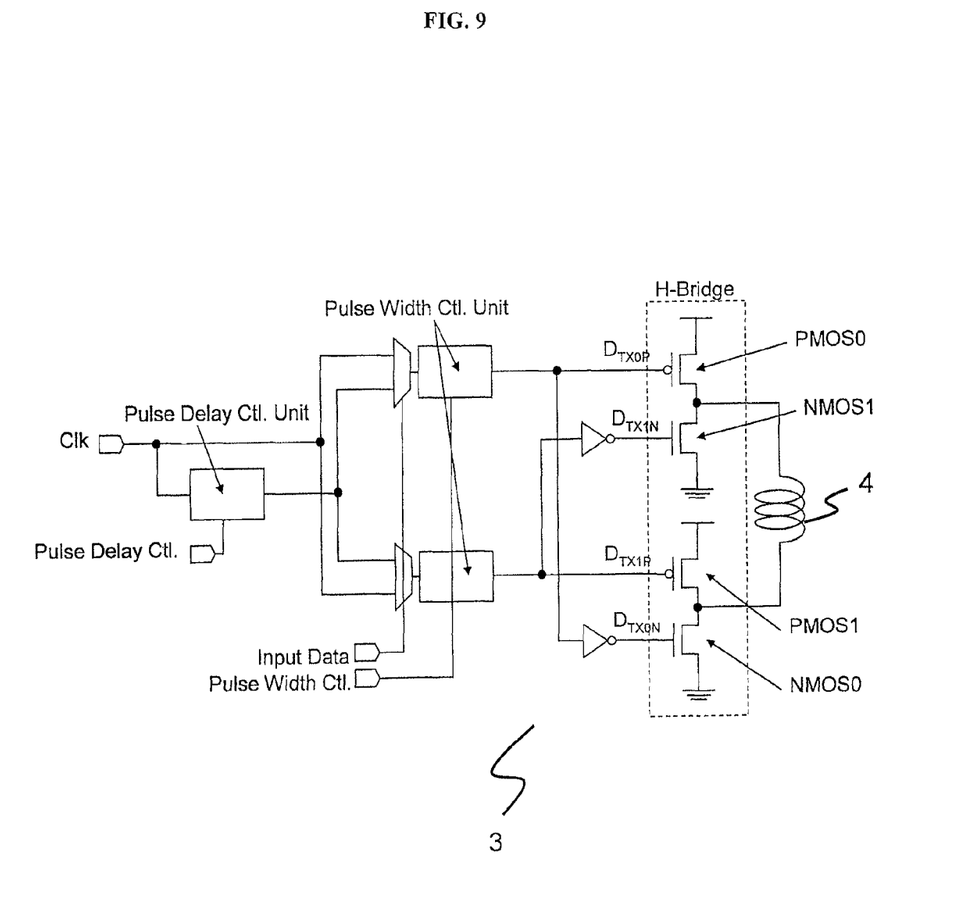
FIG. 9 is a circuit diagram showing an example of the transmission circuit shown in FIG. 8.

FIG. 9 is a circuit diagram showing an example of transmission circuit 3 shown in FIG. 8. The circuit shown in FIG. 9 is illustrated by way of example only, and transmission circuit 3 is not limited to the illustrated circuit configuration.

Transmission circuit 3 shown in FIG. 8 is a general circuit for converting an input signal into a signal to be output to transmission coil 4, as shown in FIG. 9.

Figure 10:
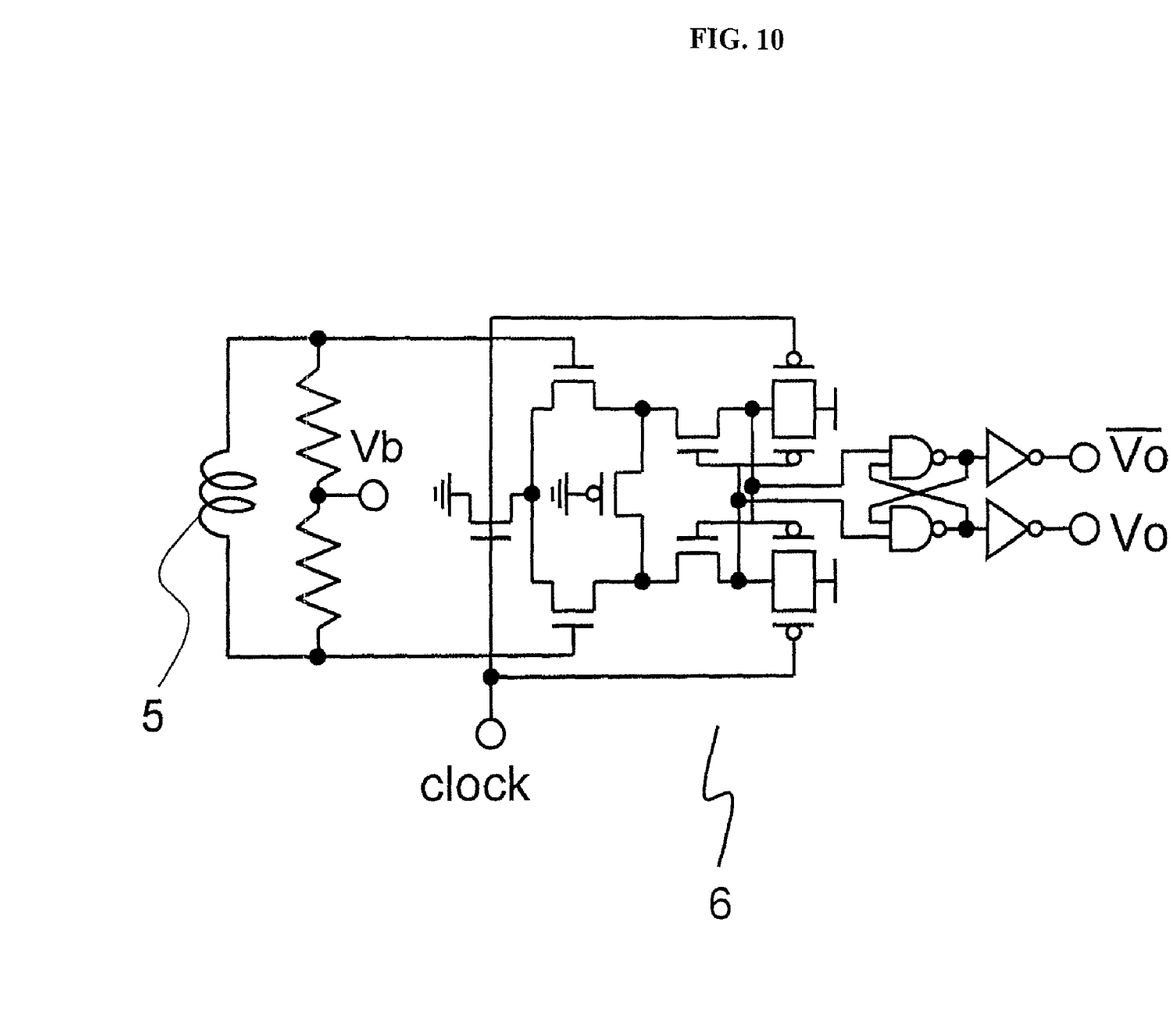
FIG. 10 is a circuit diagram showing an example of the reception circuit shown in FIG. 8.

FIG. 10 is a circuit diagram showing an example of reception circuit 6 shown in FIG. 8. The circuit shown in FIG. 10 is illustrated by way of example only, and transmission circuit 3 is not limited to the illustrated circuit configuration.

Reception circuit 6 shown in FIG. 8 is a general circuit for sampling and outputting a signal that appears across reception coil 5, as shown in FIG. 10.

The intensity of the signal induced by reception coil 5 is proportional to a coefficient of coupling between transmission coil 4 and reception coil 5. For increasing the coefficient of coupling, it is effective to reduce the distance between transmission coil 4 and reception coil 5. It is thus effective to position transmission coil 4 and reception coil 5 near the end faces of respective semiconductor chips 1, 2 and also to position semiconductor chips 1, 2 such that transmission coil 4 and reception coil 5 are positioned adjacent to each other.

Shapes of transmission coil 4 will be described below.

It is the general practice to use square coils for signal transmission between stacked semiconductor chips according to the background art. When a signal is transmitted between semiconductor chips 1, 2 disposed in one plane in the present exemplary embodiment, a magnetic flux generated by side A shown in FIG. 7, which is remotest from reception coil 5 among the wires of transmission coil 4, and which is detected by reception coil 5 is directed opposite to a magnetic flux generated by side B shown in FIG. 7, which is closest to reception coil 5, and which is detected by reception coil 5, and hence this tends to weaken the magnetic fluxes directed through reception coil 5. Therefore, the intensity of the signal induced by reception coil 5 is reduced. As a consequence, it is inefficient to use square coils.

Figure 11:
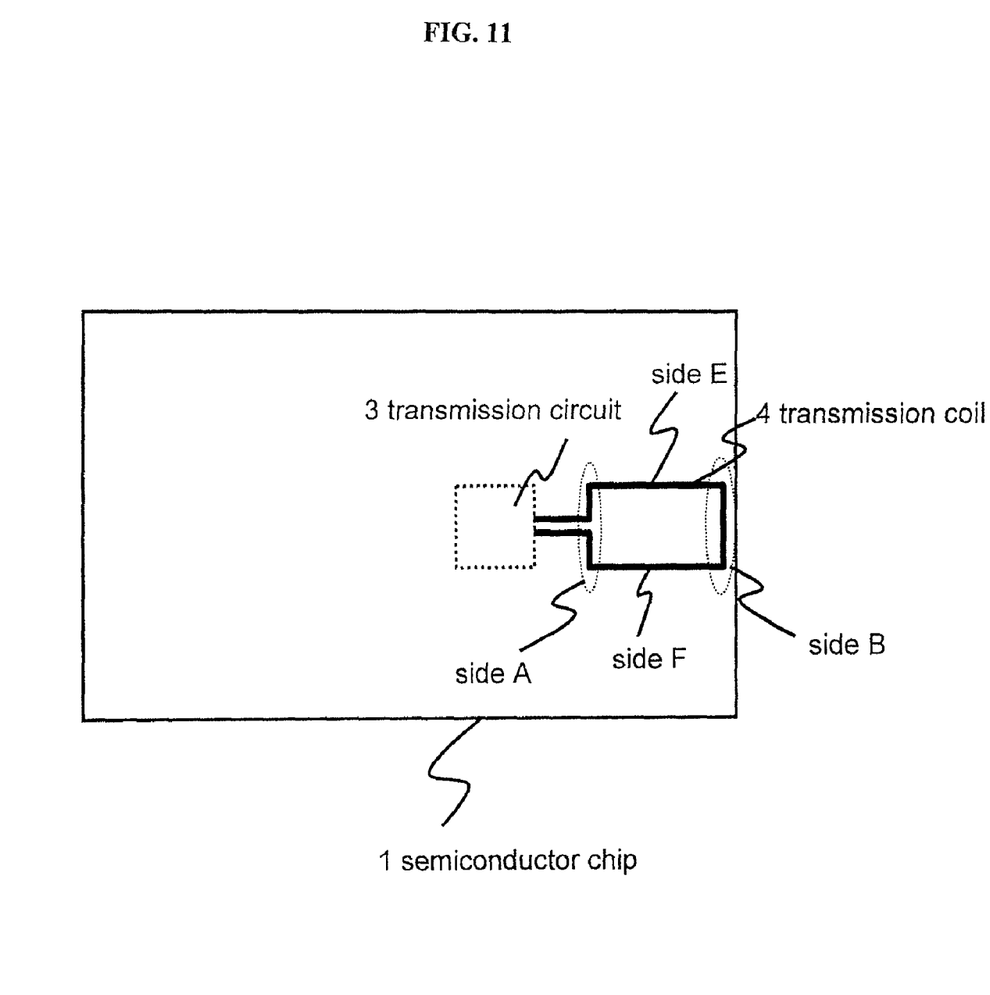
FIG. 11 is a plan view showing a transmission coil having a rectangular shape for the semi-conductor chip shown in FIG. 4 or 5.

FIG. 11 is a plan view showing transmission coil 4 having a rectangular shape for semiconductor chip 1 shown in FIG. 4 or 5.

As shown in FIG. 11, transmission coil 4 is of a rectangular shape in which side A of transmission coil 4 is farther from reception coil 5, i.e., sides E, F are longer than sides A, B. Since fewer magnetic fluxes go through reception coil 5, the intensity of the signal induced by reception coil 5 increases. The direction of shorter sides A, B is perpendicular to the direction in which the signal is transmitted.

Figure 12:
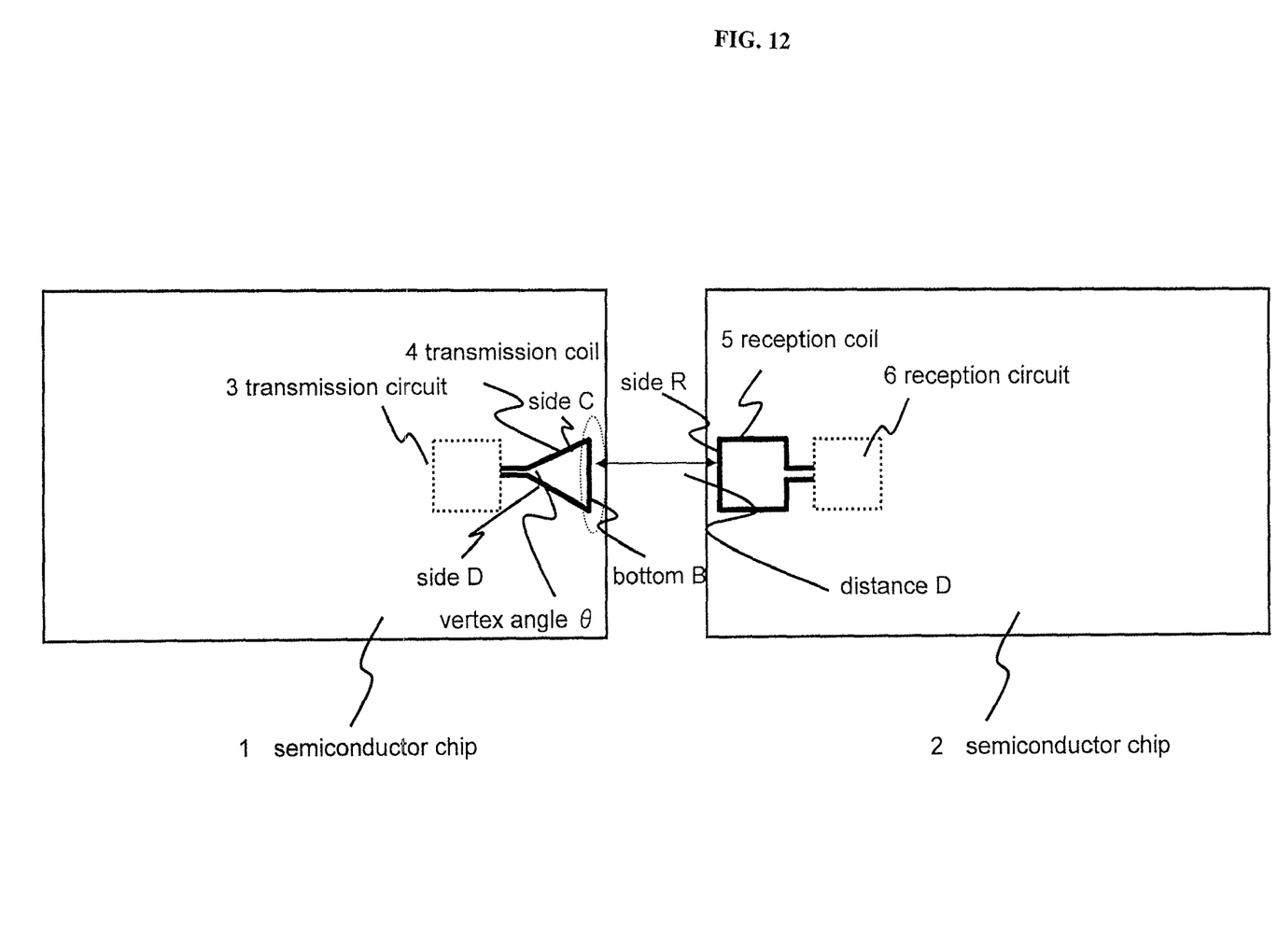
FIG. 12 is a plan view showing a transmission coil having a triangular shape for the semi-conductor chip shown in FIG. 4 or 5.

FIG. 12 is a plan view showing a transmission coil having a triangular shape for semiconductor chip 1 shown in FIG. 4 or 5.

As shown in FIG. 12, transmission coil 4 is of a triangular shape in which side B shown in FIG. 11 serves as bottom B. The triangular shape shown in FIG. 12 offers the same advantages as described above. Magnetic fields generated by sides C, D on both sides of vertex angle θ run outside reception coil 5. Since these magnetic fields do not act to weaken the magnetic flux generated by bottom B, it is possible to transmit signals efficiently. The direction of bottom B is perpendicular to the direction in which the signal is transmitted. Transmission coil 4 should preferably be of an isosceles triangular shape in which the length of side C and the length of side D are equal to each other. Vertex angle θ and bottom B of transmission coil 4, side R of reception coil 5 which is closest to transmission coil 4, and distance D between transmission coil 4 and reception coil 5 should preferably satisfy the following equation:

$$D > B/2 \times \tan(\theta/2) + R/2 \times \tan(\theta/2)$$

Stated otherwise, distance D should preferably be of a value greater than the sum of the product of the tangent of half of vertex angle θ and half of bottom B and the product of the tangent of half of vertex angle θ and half of side R.

Figure 13:
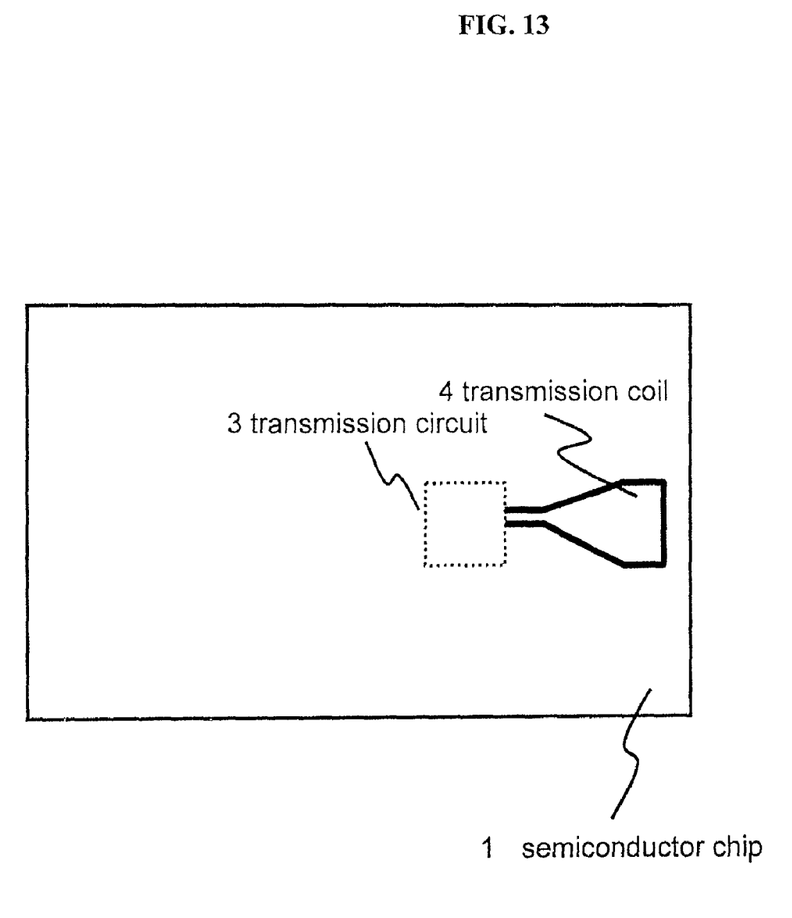
FIG. 13 is a plan view showing a transmission coil having a pentagonal shape for the semi-conductor chip shown in FIG. 4 or 5.

FIG. 13 is a plan view showing transmission coil 4 having a pentagonal shape for semiconductor chip 1 shown in FIG. 4 or 5.

As shown in FIG. 13, transmission coil 4 may be of a pentagonal shape in order to a sharp angle change at vertex angle θ shown in FIG. 12. Transmission coil 4 may be of any of other polygonal shapes to offer the same advantages as described above. The direction of one of the sides of the polygonal shapes is perpendicular to the direction in which the signal is transmitted.

According to the above configurations described thus far, the magnetic fluxes running through the reception coil are maximized by controlling the shape of the transmission coil. However, the transmission coil may be of the same shape as with the background art, and a portion of the coil except side B may be covered with a metal surface.

Figure 14:
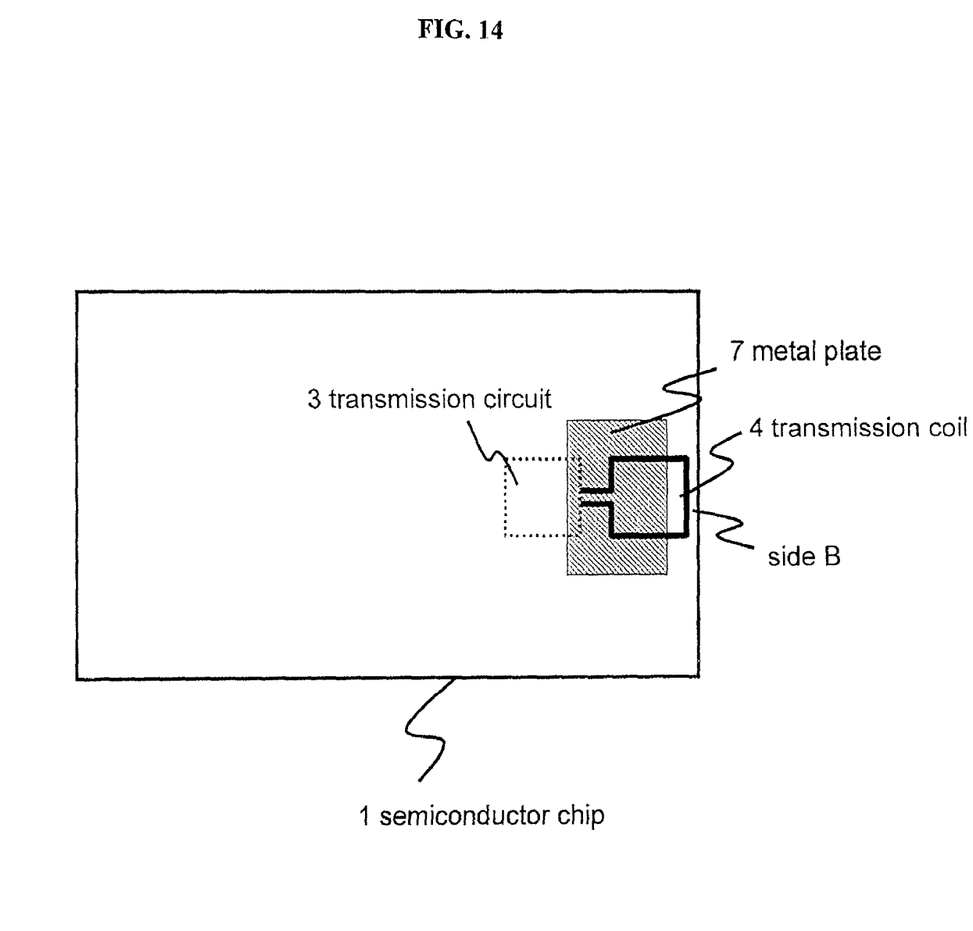
FIG. 14 is a plan view showing the configuration of a semiconductor chip using a shield.

FIG. 14 is a plan view showing the configuration of a semiconductor chip using a shield.

As shown in FIG. 14, a portion of the coil except side B is shielded by metal plate 7 for blocking the magnetic fluxes generated by the coil except side B. Accordingly, efficient signal transmission can be performed. The portion shielded by metal plate 7 may be an upper portion, or a lower portion, or both upper and lower portions of a portion of the coil other than a side thereof serving as side B.

An exemplary embodiment of semiconductor devices on a wafer before it is diced into chips will be described below.

Figure 15:
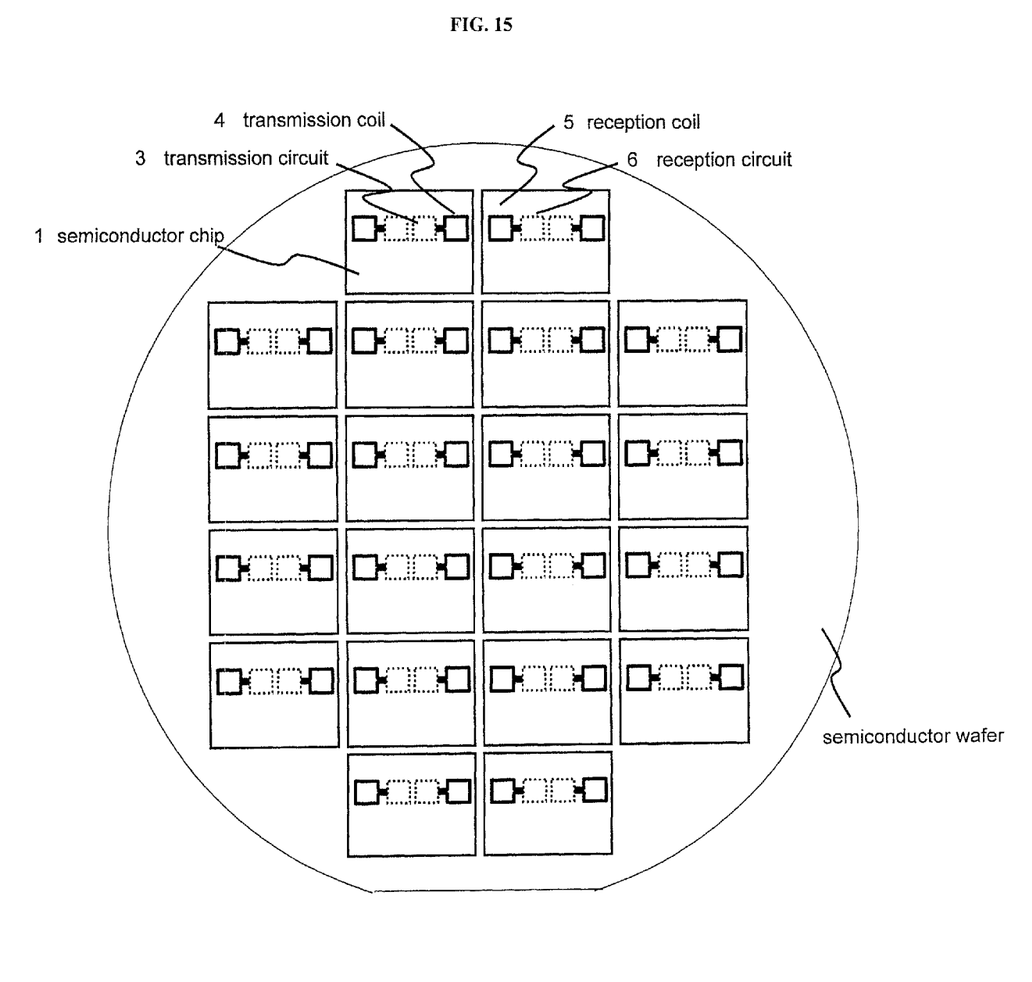
FIG. 15 is a view of semiconductor devices on a wafer to which the present invention is applied.

FIG. 15 is a view of semiconductor devices on a wafer to which the present invention is applied.

As with different chips encapsulated in packages for signal transmission therebetween, transmission coil 4, transmission circuit 3, reception coil 5, and reception circuit 6 are disposed on each semiconductor chip 1 near its end faces, as shown in FIG. 15, so that signal transmission between semiconductor chips 1 can be realized in a contactless manner.

The figures referred to in the description of the exemplary embodiments show an arrangement in which transmission coil 4 and reception coil 5 are disposed on the upper surfaces of semiconductor chips 1, 2. However, transmission coil 4 and reception coil 5 may be disposed on side surfaces of semiconductor chips 1, 2.

According to the present invention, as described above, since contactless signal transmission can be performed by way of electromagnetic induction between semiconductor chips that are not stacked one on the other, the package volume can be reduced, and the manufacturing cost can be reduced. Since signal transmission can be performed across scribe lines between semiconductor chips on a wafer before the wafer is diced, test signals can be input to and output from the semiconductor chips. The time required to carry out the wafer level inspection process is greatly shortened, and hence the cost of the test is reduced.

The present invention has been described above in reference to the exemplary embodiments. However, the present invention is not limited to the above exemplary embodiments. Rather, various changes that can be understood by those skilled in the art within the scope of the invention may be made to the arrangements and details of the present invention.

The present application is based upon and claims the benefit of priority from Japanese patent application No. 2008-064165, filed on Mar. 13, 2008, the disclosure of which is incorporated herein in its entirety by reference.

The invention claimed is:

1. A semiconductor device comprising:
   a first semiconductor chip having a first electromagnetic induction coil disposed thereon,
   a second semiconductor chip having a second electromagnetic induction coil disposed thereon, and
   a first circuit connected to both ends of said first electromagnetic induction coil and providing a closed loop,
   wherein said first circuit detects an induction signal induced by a change in a magnetic field signal which goes through said closed loop and is output from said second electromagnetic induction coil, and a signal is transmitted between said second semiconductor chip and said first semiconductor chip by way of electromagnetic induction between said first electromagnetic induction coil and said second electromagnetic induction coil,
   wherein said second electromagnetic induction coil is not disposed in a direction perpendicular to said first electromagnetic induction coil,
   wherein said second electromagnetic induction coil is of an isosceles triangular shape, and a direction of the bottom of said second electromagnetic induction coil is perpendicular to a direction in which said signal is transmitted, and
   wherein said second electromagnetic induction coil comprises a transmission coil having a vertex angle which satisfies a relationship in which a distance between said first electromagnetic induction coil and said second electromagnetic induction coil for transmitting the signal is of a value greater than the sum of the product of the tangent of half of the vertex angle of said second electromagnetic induction coil and half of the length of the bottom of said second electromagnetic induction coil and the product of the tangent of half of the vertex angle of said second electromagnetic induction coil and half of the length of a side of said first electromagnetic induction coil for receiving the signal which is closest to said first electromagnetic induction coil.

2. The semiconductor device according to claim 1, wherein said second semiconductor chip is not disposed in a direction perpendicular to said first semiconductor chip.

3. The semiconductor device according to claim 2, wherein said first semiconductor chip and said second semiconductor chip are disposed in one plane.

4. The semiconductor device according to claim 1, wherein at least one portion from among an upper portion and a lower portion of one or more portions of sides of said second electromagnetic induction coil, other than a side thereof which is closest to said first electromagnetic induction coil, is covered with a metal plate.

* * * * *